United States Patent
Aoki (10) Patent No.: US 6,967,504 B2
(45) Date of Patent: Nov. 22, 2005

(54) DIFFERENTIAL OUTPUT CIRCUIT FOR IMPROVING BANDWIDTH

(75) Inventor: Yasushi Aoki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/671,678

(22) Filed: Sep. 29, 2003

(65) Prior Publication Data

US 2004/0061532 A1    Apr. 1, 2004

(30) Foreign Application Priority Data

Sep. 30, 2002  (JP) .............................. 2002-287929

(51) Int. Cl.$^7$ ............................................. G01R 19/00
(52) U.S. Cl. ............................. 327/52; 327/57; 327/65
(58) Field of Search ............................. 327/52, 55, 57, 327/63, 65, 89, 560–563; 330/252, 253, 269

(56) References Cited

U.S. PATENT DOCUMENTS

| | | | | |
|---|---|---|---|---|
| 4,984,201 A | * | 1/1991 | Sato et al. | 365/154 |
| 5,121,284 A | * | 6/1992 | Onodera et al. | 361/152 |
| 5,274,275 A | * | 12/1993 | Colles | 327/77 |
| 5,345,121 A | * | 9/1994 | Itoh | 327/55 |
| 5,399,928 A | * | 3/1995 | Lin et al. | 327/434 |
| 5,525,919 A | * | 6/1996 | Phelan | 327/52 |
| 5,592,097 A | * | 1/1997 | Shimizu et al. | 324/546 |
| 5,619,150 A | * | 4/1997 | Briner | 327/55 |
| 5,699,305 A | * | 12/1997 | Kawashima | 365/190 |
| 5,767,699 A | * | 6/1998 | Bosnyak et al. | 326/86 |
| 5,874,840 A | * | 2/1999 | Bonaccio | 327/55 |
| 6,114,906 A | * | 9/2000 | Fukui | 330/252 |
| 6,157,219 A | * | 12/2000 | Okada | 327/55 |
| 6,404,229 B1 | * | 6/2002 | Barnes | 326/68 |
| 6,407,590 B2 | * | 6/2002 | Bass | 327/55 |
| 6,462,590 B2 | * | 10/2002 | Warwar | 327/108 |
| 6,724,248 B2 | * | 4/2004 | Llewellyn | 330/9 |
| 6,781,445 B2 | * | 8/2004 | Feldman | 327/563 |

FOREIGN PATENT DOCUMENTS

| | | |
|---|---|---|
| JP | 7-16158 | 2/1995 |
| JP | 9-162653 | 6/1997 |

\* cited by examiner

Primary Examiner—Timothy P. Callahan
Assistant Examiner—Hai L. Nguyen
(74) Attorney, Agent, or Firm—Young & Thompson (57) ABSTRACT

A differential output circuit includes first and second inputs, first and second outputs, a resistor element connected between the outputs, first and second N-channel MISFETs, and first and second P-channel MISFETs. The inputs respectively receive first and second complementary input signals. The first N-channel MISFET has a source connected to the first input, a gate receiving a power supply potential, and a drain connected to the first output. The second N-channel MISFET has a source connected to the second input, a gate receiving the power supply potential, and a drain connected to the second output. The first P-channel MISFET has a source receiving the power supply potential, a gate connected to the second input, and a drain connected to the first output. The second P-channel MISFET has a source receiving the power supply potential, a gate connected to the first input, and a drain connected to the second output.

3 Claims, 8 Drawing Sheets

DIFFERENTIAL OUTPUT CIRCUIT FOR IMPROVING BANDWIDTH

BACKGROUND OF THE INVENTION

1. Field of the Invention

The present invention is related to a differential output circuit, in particular, to a differential output circuit responsive to a pair of complementary input signals to output a pair of complementary output signals.

2. Description of the Related Art

Semiconductor integrated circuits often include differential output circuits, which are responsive to a pair of complementary input signals to output a pair of complementary output signals. Differential output circuits are very noise resistive, and their characteristics are almost free from the effects of inevitable manufacturing variation. These advantages promote wide use of the differential output circuits, such as receiver/transmitters of cellular phones.

Impedance matching is of importance for the differential output circuits to avoid waveform distortion of output signals. Japanese Unexamined Patent Application No. Heisei 9-162653 discloses a differential output circuit having a pair of MOS transistors whose sources are connected to VSS through an inductive element. The inductive element effectively cancels the parasitic capacitance of the differential output circuit, and thereby achieves impedance matching.

Japanese Examined Patent Gazette No. Heisei 7-16158 discloses a conventional differential output circuit which adopts a pass transistor logic technology, which uses not only gates of MOS transistors but also sources and drains for inputs of logic gates, for increasing the operation speed. Other advantages of the pass transistor logic are the simple design and the reduced power consumption.

Figure 1:
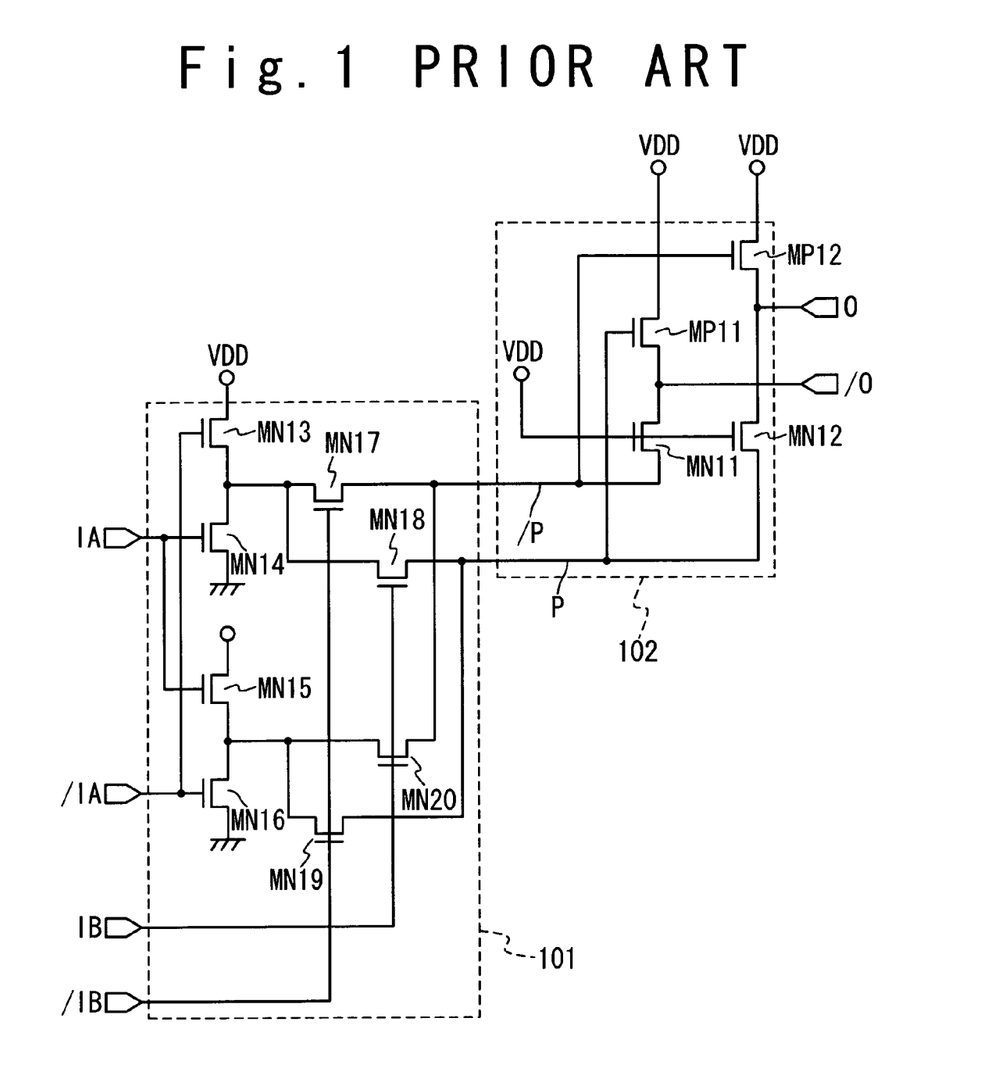
FIG. 1 is a circuit diagram of a conventional differential output circuit.

FIG. 1 is a circuit diagram of the conventional differential output circuit. The conventional differential output circuit 102 receives a pair of complementary signals P and /P from a logic circuit 101 including N-channel MOS transistors MN13 to MN20. The logic circuit 101 receives input signals IA, IB, /IA and /IB, the input signals /IA and /IB being complementary to the input signals IA, IB, respectively. The logic circuit 101 functions as an XOR gate and develops signals P and /P, the signal P being the XOR of the input signals IA and IB, and the signal /P is complementary to the signal P.

The conventional differential output circuit 102 includes a pair of N-channel transistors MN11 and MN12, and a pair of P-channel transistors MP11 and MP12. The N-channel transistor MN11 and P-channel transistor MP11 are connected in series between a power supply terminal and an inverting input receiving the signal /P, while N-channel transistor MN12 and P-channel transistor MP12 are connected in series between a power supply terminal and a non-inverting input receiving the signal P. The P-channel transistors MP11 and MP12 respectively receive the signals P and /P on the gates thereof. The gates of the N-channel transistors MN11 and MN12 are connected to a power supply terminal. The conventional differential output circuit 102 develops a pair of output signals O and /O on the drains of the N-channel transistor MN12 and MN11, respectively.

Although the differential output circuit 102 includes P-channel transistors MP11 and MP12, which are generally inferior to N-channel transistors in the operation speed, the differential output circuit 102 enjoys fast operation speed. This is because the pull-up of the output signals O and /O are achieved by not only the P-channel transistors MP11 and MP12 but also the pull-up transistor of the logic circuit 101 (that is, the N-channel transistor MN13).

The wide bandwidth is of importance for differential output circuits. Therefore, a need exists to provide a differential output circuit having a wide bandwidth.

SUMMARY OF THE INVENTION

An object of the present invention is to provide a differential output circuit having a wide bandwidth.

Another object of the present invention is to provide a differential output circuit that can be operated at high frequencies.

In an aspect of the present invention, a differential output circuit is composed of first and second inputs, first and second outputs, a resistor element connected between the first and second outputs, first and second N-channel MISFETs, and first and second P-channel MISFETs. The first and second inputs respectively receives first and second input signals complementary to each other. The first N-channel MISFET has a source connected to the first input, a gate receiving a power supply potential, and a drain connected to the first output. The second N-channel MISFET has a source connected to the second input, a gate receiving the power supply potential, and a drain connected to the second output. The first P-channel MISFET has a source receiving the power supply potential, a gate connected to the second input, and a drain connected to the first output. The second P-channel MISFET has a source receiving the power supply potential, a gate connected to the first input, and a drain connected to the second output.

The resistive element provides signal paths from the first and second outputs to the first and second inputs to form negative feedback loops. These negative feedback loops effectively flatten and extend frequency response, and enlarge the bandwidth of the differential output circuit.

The differential output circuit preferably includes an inductive element, the resistive element and the inductive element being connected in series between the first and second outputs. The inductive element effectively cancels the capacitate impedance formed by the load capacitance and the parasitic capacitance of the first and second outputs. This avoids the decrease in the gain at high frequencies, and thus effectively enlarges the bandwidth of the differential output circuit.

It is advantageous if the inductive element includes first and second inductors having a substantially same inductance, the first inductor being connected between one terminal of the resistive element and the first output, and the second inductor being connected between another terminal of the resistive element. This architecture allows the circuit arrangement to be symmetrical, and thereby effectively improves symmetry of the output signals developed on the first and second outputs.

It is also advantageous if the resistive element includes first and second resistors having a substantially same resistance, the first resistor being connected between one terminal of the inductive element and the first output, and the second resistor being connected between another terminal of the inductive element. This architecture also improves symmetry of the output signals In another aspect of the present invention, a differential output circuit is composed of first and second inputs, an output circuit, and an inductive element. The first and second inputs respectively receives first and second input signals complementary to each other. The output circuit develops first and second complementary output signals on first and second outputs in response to the first and second input signals, respectively. The inductive element is connected between the first and second outputs.

This architecture effectively increases the gain through LC resonance at a frequency range around the resonance frequency. The inductive element resonates with the capacitive impedance formed of the load capacitance and parasitic capacitance of the outputs at a resonance frequency. The resonance of the inductive element and the capacitive impedance effectively increases the gain around the resonance frequency. Therefore, this differential output circuit is suitable for amplification of a periodic signal, such as a clock signal and a sinusoidal signal, having a frequency around the resonance frequency.

These aforementioned differential output circuits are preferably accompanied by a logic circuit including a first pull-up N-channel MISFET used for pull-up of the first input signal, and a second pull-up N-channel MISFET used for pull-up of the second input signal. The first and second pull-up MISFET help the pull-up of the outputs of the differential output circuits, and effectively improves the operation speed of the differential output circuits.

DESCRIPTION OF THE PREFERRED EMBODIMENTS

Preferred embodiments of the present invention are described below in detail with reference to the attached drawings.

First Embodiment

Figure 2:
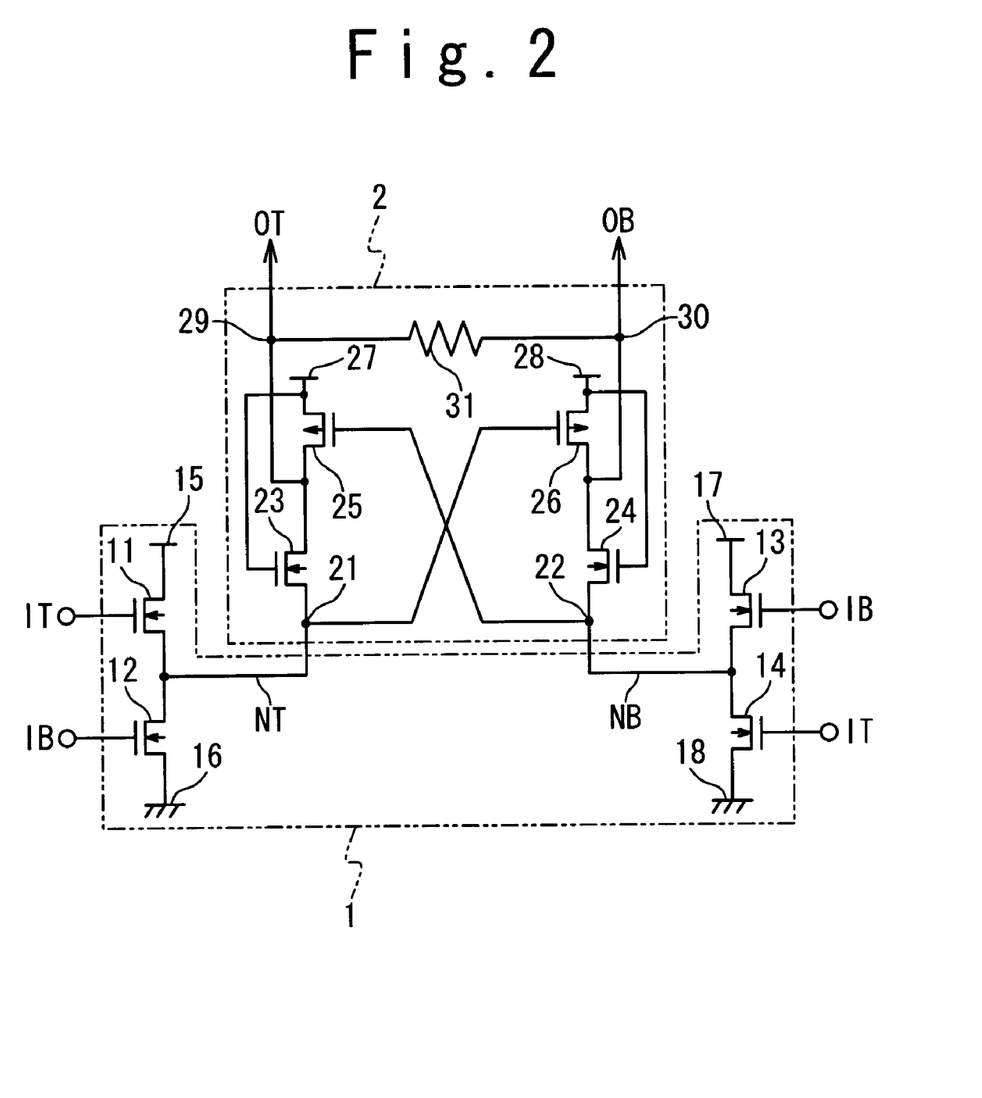
FIG. 2 is a circuit diagram of an integrated circuit including a differential output circuit in a first embodiment of the present invention.

In a first embodiment, as shown in FIG. 2, an integrated circuit is composed of a logic circuit 1 and a differential circuit 2 connected to the logic circuit 1. The logic circuit 1 and the differential circuit 2 are monolithically integrated within a semiconductor chip.

The logic circuit 1 functions as a buffer circuit reproducing a pair of input signals IT and IB complementary to each other. The logic circuit 1 outputs an output signal NT having the same logic level as the input signal IT, and outputs an output signal NB having the same logic level as the input signal IB. The output signal NB is complementary to the output signal NT.

The logic circuit 1 includes N-channel MOS (Metal oxide semiconductor) transistors 11 through 14, power supply terminals 15, 17, earth terminals 16, and 18. The power supply terminals 15 and 17 have a power supply potential $V_{DD}$, and the earth terminals 16, and 18 have an earth potential $V_{SS}$. A drain of the N-channel MOS transistor 11 is connected to the power supply terminal 14, and a source of the N-channel MOS transistor 11 is connected to a drain of the N-channel MOS transistor 12. A source of the N-channel MOS transistor 12 is connected to the earth terminal 16. A drain of the N-channel MOS transistor 13 is connected to the power supply terminal 17, and a source of the N-channel MOS transistor 13 is connected to a drain of the N-channel MOS transistor 14. A source of the N-channel MOS transistor 14 is connected to the earth terminal 18. The gates of the N-channel MOS transistors 11 and 14 receives the input signal IT, while the gates of the N-channel MOS transistors 12 and 13 receives the input signal IB. The signal NT is developed on the source of the N-channel MOS transistor 11, and the signal NB is developed on the source of the N-channel MOS transistor 13.

The differential output circuit 2 receives the signals NT and NB, and outputs a pair of output signals OT and OB. The output signal OT has the same logic value as the signal NT, while the output signal OB has the same logic value as the signal NB.

Below is the detail of the differential output circuit 2. The differential output circuit 2 is composed of input terminals 21, 22, N-channel MOS transistor 23, 24, P-channel MOS transistors 25, 26, power supply terminals 27, 28, output terminals 29, 30, and a resistor 31. The inputs 21 and 22 respectively receives the signals NT and NB from the logic circuit 1.

The input terminal 21 is connected to a source of the N-channel MOS transistor 23. A gate of the N-channel MOS transistor 23 is connected to the power supply terminal 27, and a drain of the N-channel MOS transistor 23 is connected to the output terminal 29. The drain of the N-channel MOS transistor 23 is also connected to a drain of the P-channel MOS transistor 25. A source of the P-channel transistor 25 is connected to the power supply terminal 27, and a gate of the P-channel MOS transistor is connected to the input terminal 22.

The input terminal 22 is connected to a source of the N-channel MOS transistor 24. A gate of the N-channel MOS transistor 24 is connected to the power supply terminal 28, and a drain of the N-channel MOS transistor 24 is connected to the output terminal 30. The drain of the N-channel MOS transistor 24 is also connected to a drain of the P-channel MOS transistor 26. A source of the P-channel MOS transistor 26 is connected to the power supply terminal 28, and a gate of the P-channel MOS transistor 26 is connected to the input terminal 21. The output signals OT and OT are developed on the output terminals 29, and 30, respectively.

The resistor 31 is connected between the output terminals 29 and 30. As mentioned below, the resistor 31 is of importance for enlarging the bandwidth of the differential output circuit 2.

The differential output circuit 2 operates as described below. When the signals NT and NB have the logical high-level and the logical low-level, respectively, that is, the potentials of the signals NT and NB are set to $V_{DD}-V_T$ and $V_{SS}$, respectively, the input terminal 21 is pulled up to the logical high-level and the input terminal 22 is pulled down to the logical low-level.

In response to the pull-down of the input terminal 22, the P-channel MOS transistor 25, which has the gate connected to the input terminal 22, is turned on to pull up the output terminal 29 to the power supply potential $V_{DD}$. As a result, the output signal OT, developed on the output terminal 29, is pulled up to the logical high-level, which is the same logical level as the signal NT.

In response to the pull-up of the input terminal 21, on the other hand, the P-channel MOS transistor 26, which has the gate connected to the input terminal 21, is turned off. This results in that the output terminal 30 is supplied with the logical low-level from the input terminal 22 through the N-channel MOS transistor 27, which has the gate receiving the power supply potential $V_{DD}$ to be always turned on. As a result, the output signal OB is pulled down to the logical low-level, which is the same logical level as the signal NB.

When the signals NT and NB have the logical low-level and the logical high-level, respectively, the differential output circuit 2 executes an operation complementary to the above described operation.

As described, the differential output circuit 2 develops the output signals OT and OT having the same logic levels as the signals NT and NB, respectively.

Although the pull-up of the output signals OT and OB are achieved by the P-channel MOS transistors 25 and 26, respectively, this does not affect the operation speed of the differential output circuit 2. This is because the pull-up transistors provided for pull-up of the signals NT and NB (that is, the N-channel transistors 11 and 13) help the P-channel MOS transistors 25 and 26 to pull up the output signals OT and OB.

The resistor 31, which is connected between the output terminals 29 and 30, effectively enlarges the bandwidth of the differential output circuit 2 through establishment of negative feedback paths. The resistor 31 provides signal paths from the output terminals 29 and 30 to the input terminals 21 and 22 to achieve negative feedback. For example, an accidental increase in the potential of the output terminal 29 leads to an increase in the potential of the output terminal 30, because the output terminal 30 is connected to the output terminal 29 through the resistor 31. The increase in the potential of the output terminal 30 results in an increase in the potential of the input terminal 22. This suppresses the increase in the potential of the output terminal 29, because the increase in the potential of the input terminal 22 leads to an increase in the potential of the gate of the P-channel MOS transistor 25, and thus results in an decrease in the potential of the output terminal 29, which is connected to the drain of the P-channel MOS transistor 25. The same goes for an increase in the potential of the output terminal 30. The increase in the potential of the output terminal 30 leads to an increase in the potentials of the output terminal 29, the input terminal 21, and the gate of the P-channel MOS transistor 26, and thus suppresses the increase in the potential of the output terminal 30. The negative feedback through the resistor 31 effectively flattens the frequency response, and thus enlarges the bandwidth of the differential output circuit 2.

Figure 8:
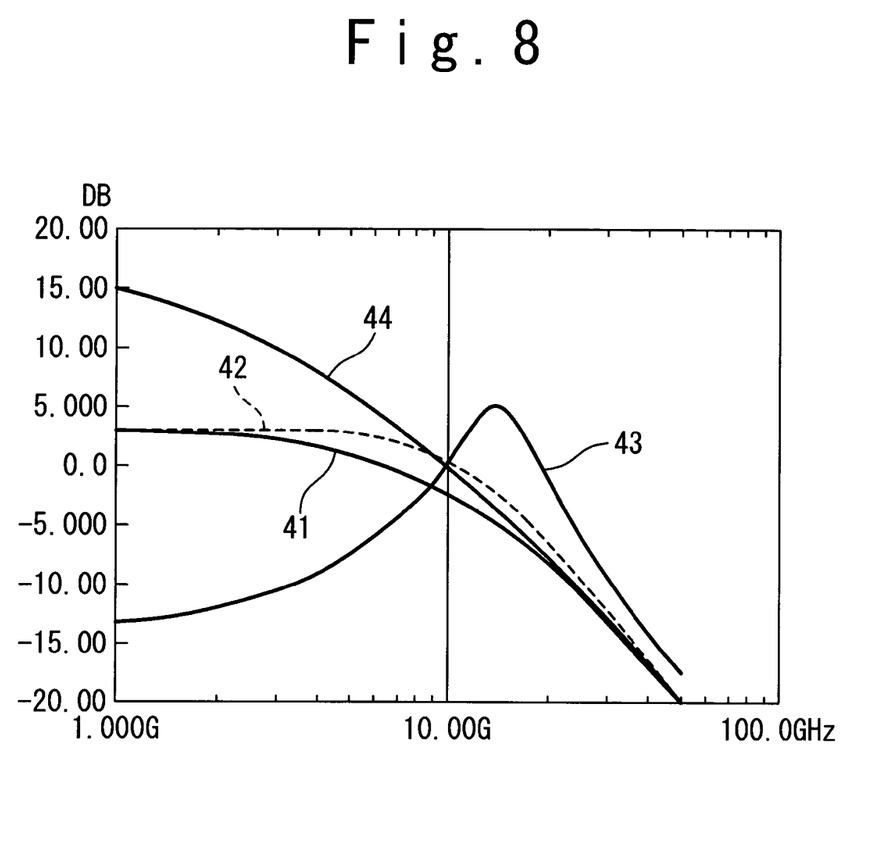
FIG. 8 is a graph illustrating frequency responses of the differential output circuits in first to third embodiments.

FIG. 8 is a graph illustrating frequency responses of the differential output circuit 2 in this embodiment, and the conventional differential output circuit 102. The vertical axis of the graph represents the gain of the differential output circuit, and the horizontal axis represents the frequency of the input signals. The curved line 41 represents the frequency response of the differential output circuit 2 in this embodiment, while the curved line 44 represents the frequency response of the conventional differential output circuit 102. These frequency responses are obtained by SPICE simulation. Although the gain of the differential output circuit 2 in this embodiment is reduced due to the negative feedback, the differential output circuit 2 exhibits a superior frequency response at high frequencies. The curved lines 41 and 42 depict that the cutoff frequency of the differential output circuit 2 is higher than that of the conventional differential output circuit 102. This implies that the differential output circuit 2 has a wider bandwidth than the conventional differential output circuit 102.

As thus described, the bandwidth of the differential output circuit 2 is enlarged by the negative feedback established with the resistor 31. This achieves high-speed operation of the differential output circuit 2.

One skilled in the art would appreciate that the logic circuit 1 may be replaced with another logic circuit generating a pair of complementary signals.

Figure 3:
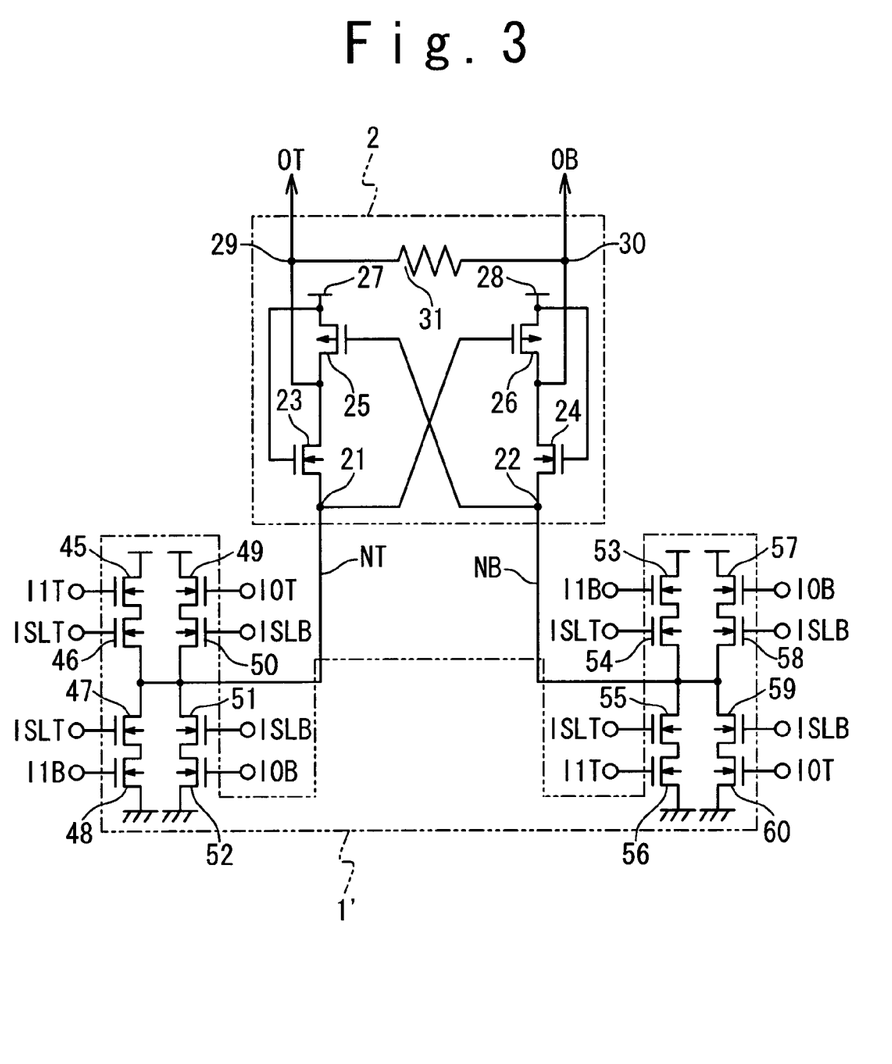
FIG. 3 is a circuit diagram of another integrated circuit including the differential output circuit in the first embodiment.

As shown in FIG. 3, for example, the logic circuit 1 may be replaced with the logic circuit 1' including N-channel MOS transistors 45 through 60. The logic circuit 1' is a selector circuit. The logic circuit 1' receives a first pair of complementary input signals I0T and I0B, and a second pair of complementary input signals I1T and I1B, and selects one of the first and second pairs in response to complementary selector signals ISLT and ISLB. When the selector signal ISLT is at the logical low-level and the selector signal ISLB is at the logical high-level, the logic circuit 1' selects the input signals I0T and I0B as the output signals NT and NB; otherwise, the logic circuit 1' selects the input signals I1T and I1B.

Figure 4:
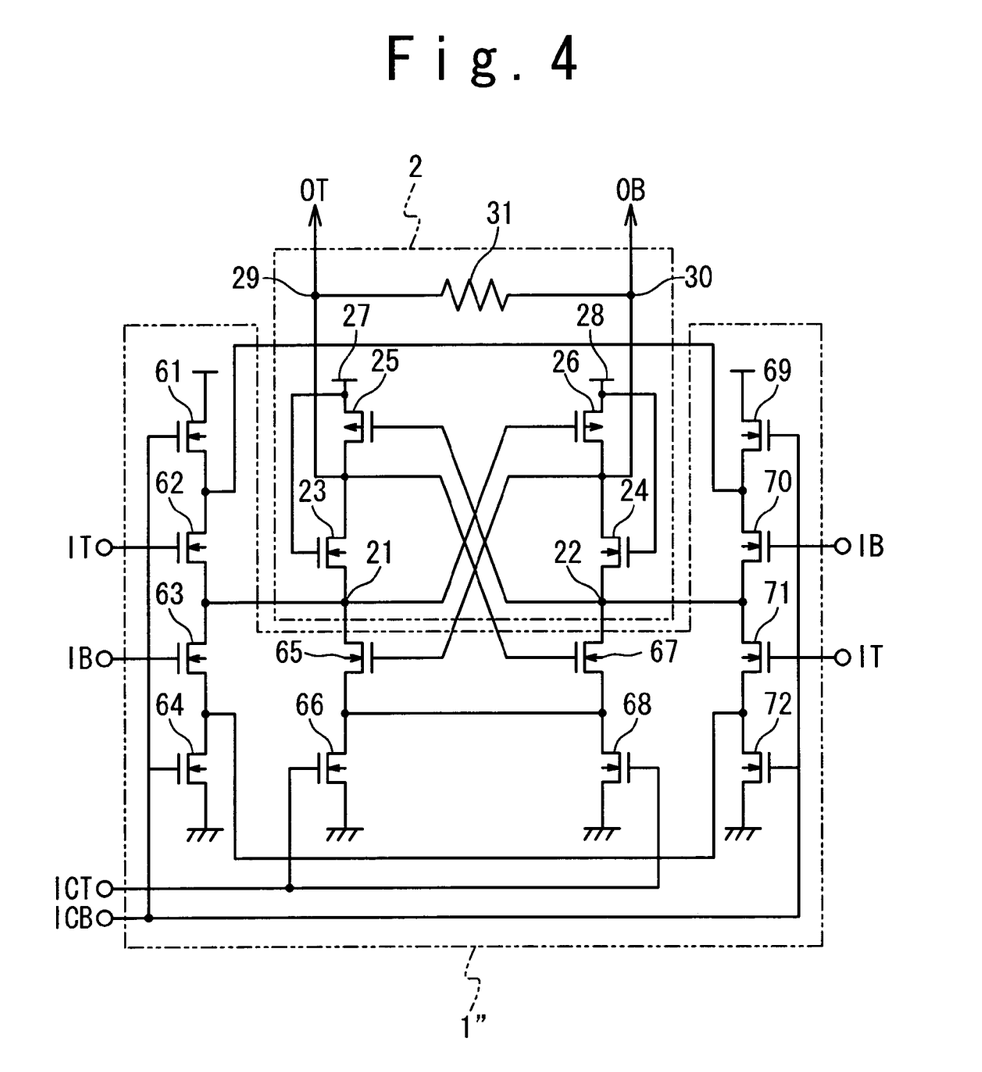
FIG. 4 is a circuit diagram of still another integrated circuit including the differential output circuit in the first embodiment.

In an alternative embodiment, the logic circuit 1 may be replaced with a logic circuit 1" including N-channel MOS transistors 61 through 72 as shown in FIG. 4 The logic circuit 1" is a latch circuit latching the input signals IT and IB in synchronization with the complementary logic signals ICT and ICB.

Second Embodiment

Figure 5:
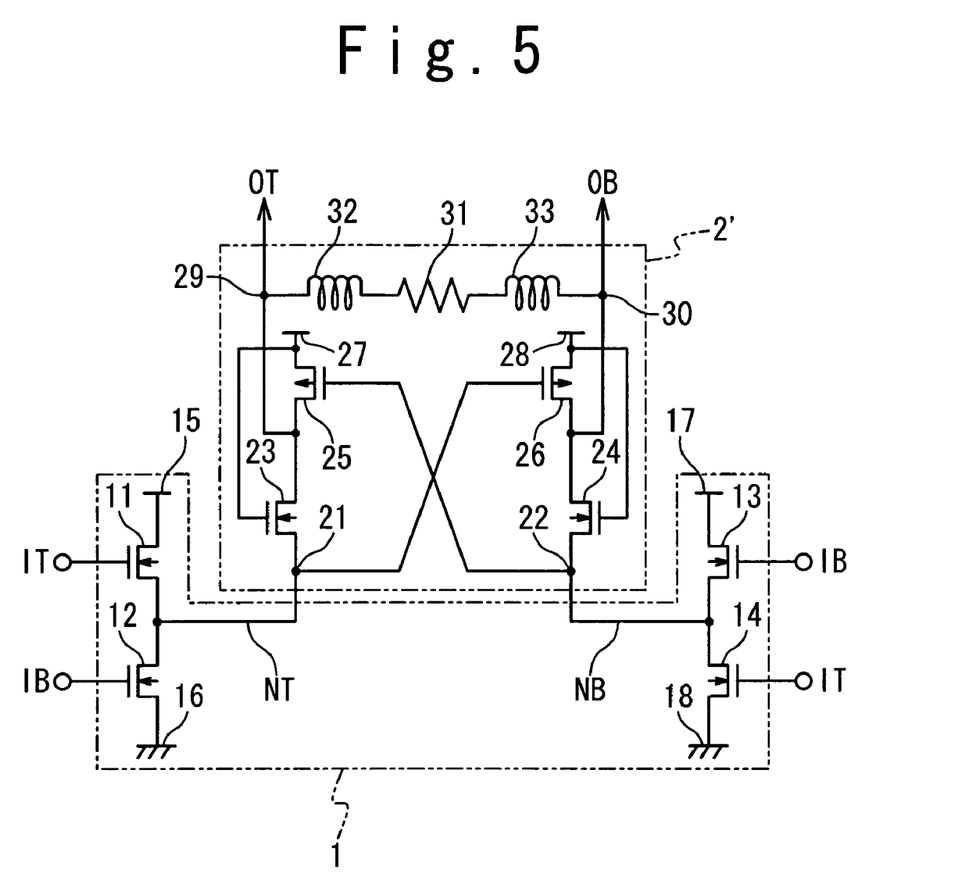
FIG. 5 is a circuit diagram of an integrated circuit including a differential output circuit in a second embodiment of the present invention.

FIG. 5 is a circuit diagram of an integrated circuit including a differential output circuit 2' in a second embodiment of the present invention. The structure of the differential output circuit 2' is almost identical to the differential output circuit 2 in the first embodiment except for that an inductor (or coil) 32 is disposed between the resistor 31 and the output terminal 29, and an inductor 33 is disposed between the resistor 31 and the output terminal 30. In other words, the inductor 32, the resistor 31, and the inductor 33 are connected in series between the output terminals 29 and 30. The inductance of the inductor 32 is substantially identical to that of the inductor 33.

As is the case with the resistor 31 in the first embodiment, the resistor 31, the inductors 32 and 33, connected between the output terminals 29 and 33, provides signal paths to achieve negative feedback, and thereby effectively enlarge the bandwidth of the differential output circuit 2'.

Furthermore, the inductors 32 and 33 effectively enlarges the bandwidth through canceling capacitive impedance of the output terminals 29 and 30. At high frequencies, the output terminals 29 and 30 are connected to earth terminals through an undesirable capacitive impedance caused by the load capacitance and parasitic capacitance of the output terminals 29 and 30. This capacitive impedance undesirably decreases the gain of the differential output circuit 2 in the first embodiment at high frequencies. The inductors 32 and 33 of the differential output circuit 2' in this embodiment, however, cancels the undesirable capacitive impedance, and thereby enlarges the gain at high frequencies.

Referring to FIG. 8, a curved line 42 represents a frequency response of the differential output circuit 2' in the second embodiment, which has the inductors 32 and 33 inserted between the output terminals 29 and 30. This frequency response is also obtained through SPICE simulation. The curved line 42 depicts that the cutoff frequency of the differential output circuit 21 in the second embodiment is higher than that of the differential output circuit 2 in the first embodiment. This implies that the differential output circuit 2' in the second embodiment is superior to the differential output circuit 2 in the first embodiment in terms of the bandwidth.

Figure 6:
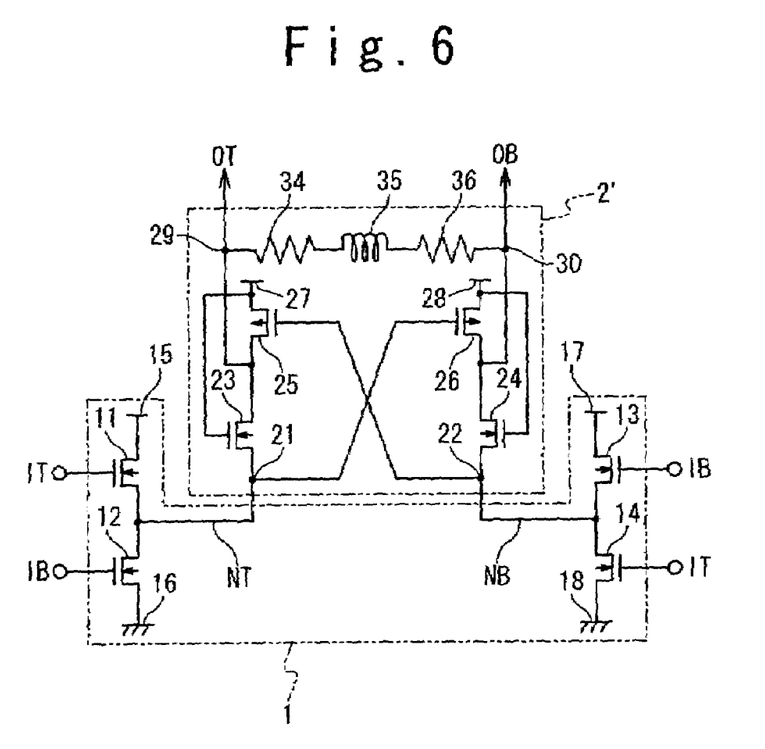
FIG. 6 is a circuit diagram of an integrated circuit including a modified differential output circuit in the second embodiment.

In this embodiment, a resistor(s) and an inductor(s) may be connected in series between the output terminals 29 and 30 in other fashions. As shown in FIG. 6, the resistor 31 and the inductors 32 and 33 may be replaced with resistors 34 and 36 and an inductor 35 connected in series between the output terminals 29 and 30, the resistors 34 and 35 having the same resistance. In an alternative embodiment, a resistor and an inductor may be connected in series between the output terminals 29 and 30.

The resistor(s) and inductor(s) are preferably connected between the output terminals 29 and 30 in a symmetric manner. For example, the differential output circuit 2' shown in FIG. 5 has such an arrangement that the resistor 31 and the inductors 32 and 33 are symmetrically arranged with respect to the output terminals 29 and 30. Correspondingly, the differential output circuit 2' shown in FIG. 6 has such an arrangement that the resistors 34 and 36 and the inductor 35 are symmetrically arranged with respect to the output terminals 29 and 30. The symmetrical arrangement of the resistor(s) and inductor(s) connected between the output terminals 29 and 30 effectively improves the symmetry of the output signals OT and OB, and thereby improves reliability of a back-end circuit connected to the output terminals 29 and 30.

It should be noted that one skilled in the art would appreciate that the logic circuit 1 may be replaced with another logic circuit generating a pair of complementary signals, as is the case with the differential output circuit in the first embodiment.

Third Embodiment

Figure 7:
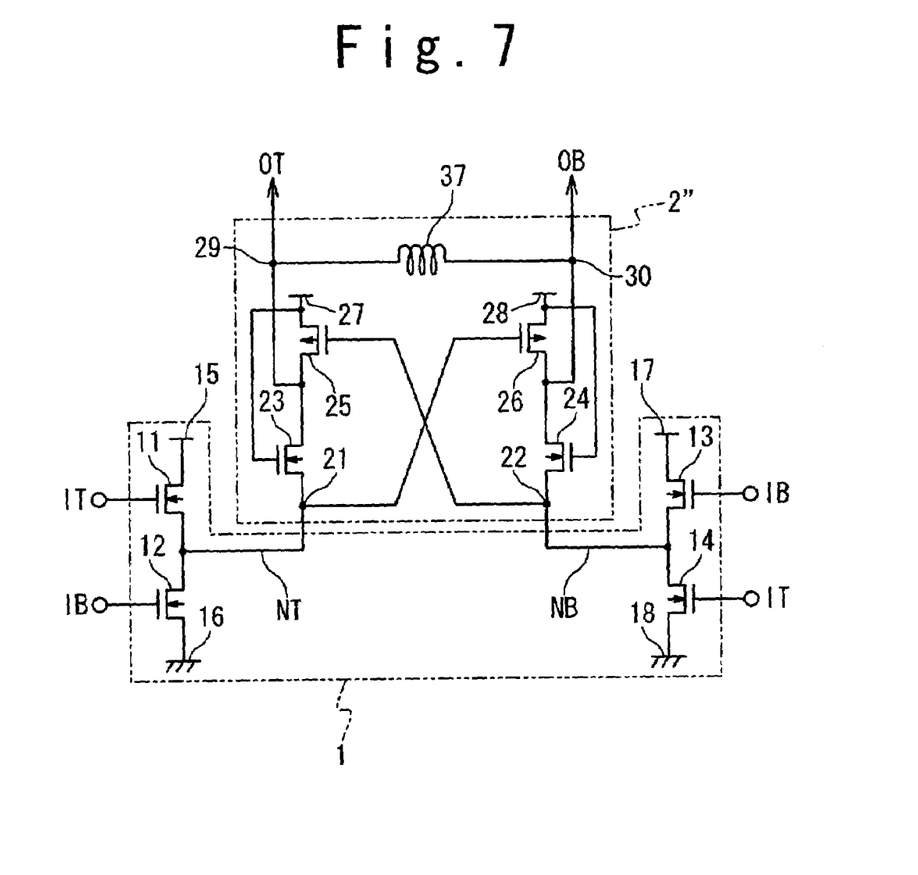
FIG. 7 is a circuit diagram of an integrated circuit including a differential output circuit in a third embodiment of the present invention.

FIG. 7 is a circuit diagram of an integrated circuit including a differential output circuit 2" in a third embodiment of the present invention. The structure of the differential output circuit 2" in the third embodiment is almost identical to the differential output circuit 2 in the first embodiment, except for that the inductor 37 is connected between the output terminals 29 and 30 in place of the resistor 31. The inductor 37 is directly connected to output terminals 29 and 30 without any element inserted therebetween.

Referring to FIG. 8, a curved line 43 represents a frequency response of the differential output circuit 2" in the third embodiment. The inductor 37 resonates with load capacitance of the output terminals 29 and 30 at a resonance frequency, and the differential output circuit 2" has a gain peak at the resonance frequency. Although having a small low-frequency gain, the differential output circuit 2" in this embodiment has a large peak gain at the resonance frequency, because no resistor is connected between the output terminals 29 and 30.

This frequency response of the differential output circuit 2" is suitable for amplification of periodic signals having a high frequency, such as high-frequency clock signals and high-frequency sinusoidal signals. In an alternative embodiment, a pair of complementary clock signals may be provided for the differential output circuit 2" through inputting a pair of complementary clock signals into the logic circuit 1 in place of the input signals IT and IB. In another alternative embodiment, a pair of sinusoidal signals whose phases are different from 180 degrees may be provided for the differential output circuit 2" through inputting a pair of sinusoidal signals whose phases are different from 180 degrees into the logic circuit 1 in place of the input signals IT and IB. Adjusting the resonance frequency to the frequency of the inputted periodic signals achieves effectively amplification of the periodic signals.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. An integrated circuit comprising:
   a logic circuit developing first and second input signals complementary to each other, wherein said logic circuit includes:
      a first pull-up N-channel MISFET used for pull-up of said first input signal, and
      a second pull-up N-channel MISFET used for pull-up of said second input signal; and
   a differential output circuit including:
      a first input receiving said first input signal;
      a second input receiving said second input signal;
      first and second outputs;
      a resistor element connected between said first and second outputs;
      a first N-channel MISFET having a source connected to said first input, a gate receiving a power supply potential, and a drain connected to said first output;
      a second N-channel MISFET having a source connected to said second input, a gate receiving said power supply potential, and a drain connected to said second output;
      a first P-channel MISFET having a source receiving said power supply potential, a gate connected to said second input, and a drain connected to said first output; and
      a second P-channel MISFET having a source receiving said power supply potential, a gate connected to said first input, and a drain connected to said second output.

2. The integrated circuit according to claim 1, further comprising an inductive element, wherein said resistive element and said inductive element are connected in series between said first and second outputs.

3. An integrated circuit comprising:
   a logic circuit developing first and second input signals complementary to each other, wherein said logic circuit includes:
      a first pull-up N-channel MISFET used for pull-up of said first input signal, and
      a second pull-up N-channel MISFET used for pull-up of said second input signal; and
   a differential output circuit including:
      a first input receiving said first input signal;

a second input receiving said second input signal;
first and second outputs;
an inductive element connected between said first and second outputs;
a first N-channel MISFET having a source connected to said first input, a gate receiving a power supply potential, and a drain connected to said first output;
a second N-channel MISFET having a source connected to said second input, a gate receiving said power supply potential, and a drain connected to said second output;
a first P-channel MISFET having a source receiving said power supply potential, a gate connected to said second input, and a drain connected to said first output; and
a second P-channel MISFET having a source receiving said power supply potential, a gate connected to said first input, and a drain connected to said second output.

* * * * *